(12) United States Patent
Tanaka et al.

(10) Patent No.: US 11,127,600 B2
(45) Date of Patent: Sep. 21, 2021

(54) ETCHING METHOD

(71) Applicant: TOKYO ELECTRON LIMITED, Tokyo (JP)

(72) Inventors: Koki Tanaka, Miyagi (JP); Maju Tomura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/793,344

(22) Filed: Feb. 18, 2020

(65) Prior Publication Data

US 2020/0263309 A1     Aug. 20, 2020

(30) Foreign Application Priority Data

Feb. 18, 2019  (JP) .............................. JP2019-026951
Feb. 4, 2020   (JP) .............................. JP2020-016826

(51) Int. Cl.
  *H01L 21/3213*   (2006.01)
  *C23F 4/00*      (2006.01)
  *H01L 21/3065*   (2006.01)
  *H01L 21/311*    (2006.01)

(52) U.S. Cl.
  CPC .......... *H01L 21/32137* (2013.01); *C23F 4/00* (2013.01); *H01L 21/3065* (2013.01); *H01L 21/31116* (2013.01); *H01L 21/31144* (2013.01); *H01L 21/32136* (2013.01)

(58) Field of Classification Search
  None
  See application file for complete search history.

(56) References Cited

U.S. PATENT DOCUMENTS

| | | | |
|---|---|---|---|
| 2017/0178922 A1* | 6/2017 | Takashima | H01J 37/32009 |
| 2017/0330759 A1* | 11/2017 | Gohira | H01L 21/67069 |
| 2018/0076048 A1* | 3/2018 | Gohira | H01L 21/0217 |

FOREIGN PATENT DOCUMENTS

| | | | | |
|---|---|---|---|---|
| JP | H07-147273 A | | 6/1995 | |
| WO | WO2019178030 | * | 9/2019 | H01L 21/3065 |

* cited by examiner

*Primary Examiner* — Jiong-Ping Lu
(74) *Attorney, Agent, or Firm* — Rothwell, Figg, Ernst & Manbeck, P.C.

(57) ABSTRACT

An etching method includes: providing a substrate including a silicon oxide film on a stage; controlling a surface temperature of the substrate to be −70° C. or lower; and etching the silicon oxide film with plasma generated by supplying a radio-frequency power to a gas containing fluorine and hydrogen, after the controlling the surface temperature of the substrate; and increasing the surface temperature of the substrate to volatilize a by-product generated by the etching.

19 Claims, 4 Drawing Sheets

ETCHING METHOD

CROSS-REFERENCE TO RELATED APPLICATIONS

This application is based on and claims priority from Japanese Patent Application Nos. 2019-026951 and 2020-016826, filed on Feb. 18, 2019 and Feb. 4, 2020, respectively, with the Japan Patent Office, the disclosures of which are incorporated herein in their entireties by reference.

TECHNICAL FIELD

The present disclosure relates to an etching method.

BACKGROUND

There has been proposed an etching method for implementing a high etching rate by etching a workpiece while cooling the workpiece. For example, Japanese Patent Laid-Open Publication No. 07-147273 proposes controlling the temperature of the workpiece to be −50° C. or lower to realize a higher etching rate.

SUMMARY

According to an embodiment of the present disclosure, an etching method includes: providing a substrate including a silicon oxide film on a stage; controlling a surface temperature of the substrate to be −70° C. or lower; etching the silicon oxide film with plasma generated by supplying a radio-frequency power to a gas containing fluorine and hydrogen, after the controlling the surface temperature of the substrate; and increasing the surface temperature of the substrate to volatilize a by-product generated by the etching.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
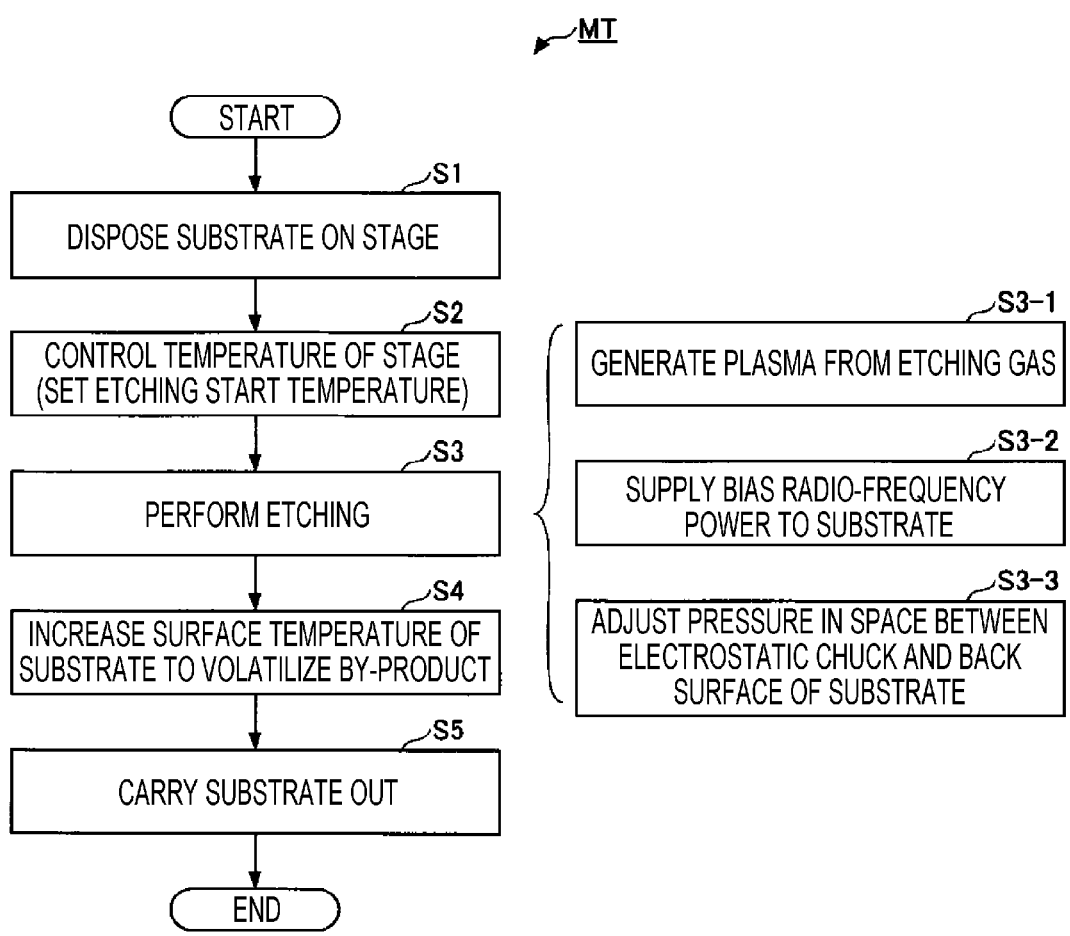
FIG. 1 is a view illustrating an etching method according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

According to an embodiment, a method of etching a film is provided. The method includes: providing a substrate including a silicon oxide film on a stage; controlling a surface temperature of the substrate to be −70° C. or lower; etching the silicon oxide film with plasma generated by supplying a radio-frequency power to a gas containing fluorine and hydrogen, after the controlling the surface temperature of the substrate; and increasing the surface temperature of the substrate to volatilize a by-product generated by the etching. According to the present embodiment, an etching rate may be improved.

According to an embodiment, the increasing the surface temperature may include controlling the surface temperature of the substrate by a pressure in a space between a back surface of the substrate and the stage and by a bias radio-frequency power supplied to the stage.

According to an embodiment, the substrate may include a silicon-containing film other than the silicon oxide film.

According to an embodiment, the substrate may include a stacked film of the silicon oxide film and a polysilicon film or a stacked film of the silicon oxide film and a silicon nitride film.

According to an embodiment, a metal-containing mask may be formed on the silicon oxide film.

According to an embodiment, the metal-containing mask may be formed of a material including tungsten, titanium, molybdenum, ruthenium, hafnium or aluminum.

According to an embodiment, an aspect ratio of a recess formed in the substrate may be 5 or more.

According to an embodiment, in the etching the silicon oxide film, a duty ratio of the bias radio-frequency power supplied to the stage may be changed.

According to an embodiment, in the etching the silicon oxide film, a duty ratio of the radio-frequency power for plasma generation may be changed.

According to an embodiment, in the etching the silicon oxide film, a pulse-type direct current (DC) voltage may be applied to the stage.

Hereinafter, embodiments for implementing the present disclosure will be described with reference to the drawings. In the respective drawings, similar portions will be denoted with the same reference numerals, and overlapping descriptions thereof will be omitted.

In the following description, a power supplied from one of two radio-frequency (RF) sources in FIG. 5 into a plasma processing apparatus may also be referred to as an HF power, and a power supplied from the other RF source into the plasma processing apparatus may also be referred to as an LF power. The HF power is a plasma-generation radio-frequency power that mainly contributes to generating plasma, and the LF power is a bias radio-frequency power that mainly contributes to drawing ions into a substrate W. The substrate W to be processed is a wafer having a diameter of 300 mm. The surface temperature of the substrate W is measured by a temperature sensor adhered to the surface of the substrate W via an adhesive such as, for example, silicone gel.

Embodiment

In the present embodiment, a method MT of etching a substrate will be described with reference to FIG. 1. In the following description, FIG. 5 will also be referred to, in addition to FIG. 1. Further, hereinafter, for example, a case where the method MT is applied to the substrate W using a plasma processing apparatus 10 will be described. The method MT includes steps S1 to S5. In addition, step S3 includes at least steps S3-1 to S3-3.

Figure 5:
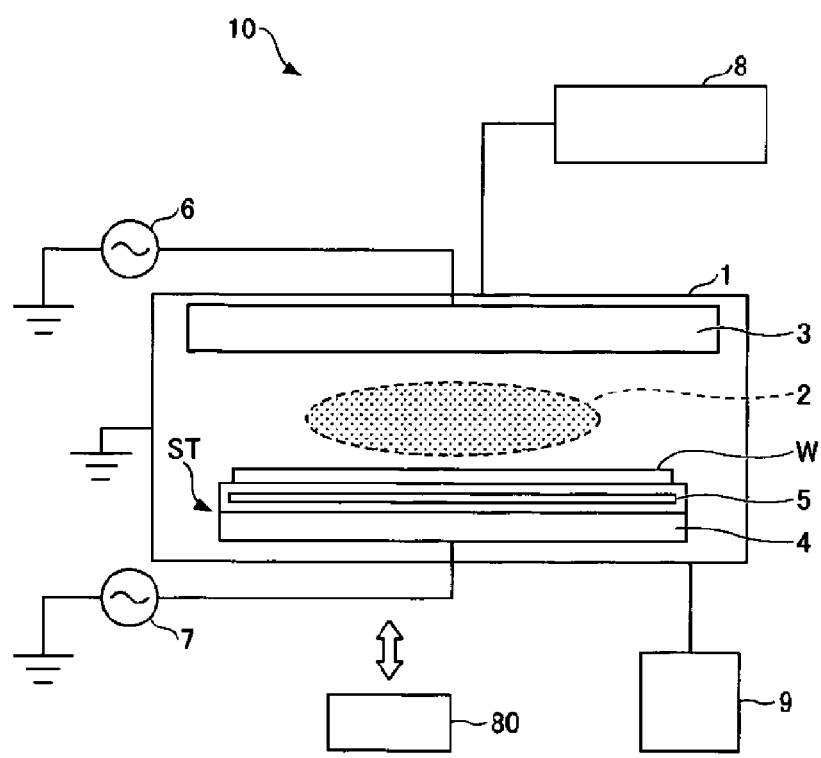
FIG. 5 is a view illustrating an example of a plasma processing apparatus according to an embodiment.

In step S1, the substrate W including an etching target film is held by a stage ST in a chamber 1 as illustrated in FIG. 5. The stage ST includes an electrostatic chuck 5, and holds the substrate W thereon by an electrostatic force. The etching target film is a silicon-containing film. The silicon-containing film includes a silicon oxide film ($SiO_2$). The silicon-containing film may further include a silicon-containing film other than the silicon oxide film. The silicon-containing film may include two or more types of silicon-containing films. The two or more types of silicon-containing films may include a stacked film of the silicon oxide film and a polysilicon film, or a stacked film of the silicon oxide film and a silicon nitride film. In the present embodiment, an example where the silicon oxide film is etched as an etching target film will be described. For example, the silicon oxide film may be used for a high aspect etching with a high aspect ratio of 30 or more for a 3D-NAND or DRAM.

The substrate W may further include a mask having an opening, on the etching target film. The mask may be a mask including various films having a selectivity with respect to the silicon-containing film (including two or more types of silicon-containing films) which is the etching target film. The mask may be a film including carbon. An example of the film including carbon includes a photoresist or an amorphous carbon. For the etching, a gas containing fluorine and hydrogen is used. The gas containing fluorine may be fluorocarbon such as $CF_4$, $C_2F_6$, $C_4F_6$ or $C_4F_8$, hydrofluorocarbon such as $CH_3F$ or $CHF_3$, a gas such as $SF_6$ or $NF_6$, or a combination of two or more gases selected therefrom. The gas containing hydrogen may be, for example, $H_2$, $NH_3$, $H_2O$ or $CH_4$. In addition to the gas described above, a rare gas such as Ar may be included. Since fluorine ions and hydrogen ions of the plasma generated from the gas containing fluorine and hydrogen are light, the fluorine ions and the hydrogen ions do not easily damage the mask. Accordingly, a relatively high mask selectivity may be obtained.

The mask on the silicon-containing film may be a metal-containing mask. The metal-containing mask is preferably formed of a tungsten (W)-based, titanium (Ti)-based, molybdenum (Mo)-based, ruthenium (Ru)-based, hafnium (Hf)-based or aluminum (Al)-based material. In addition, an aspect ratio of a recess formed in the substrate by the etching method according to the embodiment may be 5 or more.

Subsequently, in step S2, the temperature of the stage ST is set to −70° C. or lower. The stage ST may be cooled using any cooling mechanism or may be cooled by allowing a coolant such as, for example, liquid nitrogen or chlorofluorocarbon to flow through the stage ST. Then, a heat transfer gas is supplied between the electrostatic chuck 5 and the back surface of the substrate W held on the stage ST. An inert gas may be used as the heat transfer gas. An example of the inert gas includes a rare gas such as helium gas. In an example, the pressure in the space between the back surface of the substrate W and the electrostatic chuck 5 is set to 10 Torr to 200 Torr. The pressure is set such that a desired temperature increase rate of the substrate W during a plasma processing is achieved. Specifically, the pressure may be determined based on the etching start temperature and the magnitude of the LF power. For example, the pressure may be set such that a difference between the etching start temperature and the surface temperature of the substrate when the etching is ended is 30° C. to 50° C. or higher. Here, the etching start temperature refers to the temperature of the stage ST when the plasma etching is started. When no heat is input from plasma, the temperature of the stage ST and the surface temperature of the substrate W are substantially the same.

Subsequently, in step S3, the substrate W is etched. In step S3-1, an etching gas is supplied from a gas source 8 into the chamber, and a radio-frequency power of 27 MHz to 100 MHz is supplied from an RF source 6 to an upper electrode 3 to turn the etching gas into plasma. The frequency of the radio-frequency power supplied from the RF source 6 is, for example, 60 MHz. As the etching gas, fluorocarbon gas (e.g., $CF_4$) may be used. Hydrogen gas ($H_2$) is further supplied. In addition, a rare gas may be added. When the etching target film includes a silicon nitride film, fluorocarbon or hydrofluorocarbon gas (e.g., CHF) may be used as the etching gas. Hydrogen gas ($H_2$) is further supplied. In addition, a rare gas may be added. The plasma-generation radio-frequency power is not limited to a continuous wave, and may be a pulse wave having a predetermined duty ratio. The duty ratio may be changed during the etching.

In step S3-2, a bias radio-frequency power having a frequency of 200 kHz to 13.56 MHz is supplied from an RF source 7 to the stage ST, in order to draw ions in the generated plasma into the substrate W. The frequency of the radio-frequency power supplied from the RF source 7 is, for example, 3.2 MHz. The bias radio-frequency power may be 2 kW or more, and preferably 5 kW or more. More preferably, the bias radio-frequency power may be 10 kW or more. The bias radio-frequency power is not limited to a continuous wave, and may be a pulse wave having a predetermined duty ratio. The duty ratio may be changed during the etching. In addition, the bias radio-frequency power may be supplied in synchronization with the plasma-generation radio-frequency power.

In subsequent step S3-3, the pressure in the space between the back surface of the substrate W and the electrostatic chuck 5 is adjusted. The pressure is determined based on the magnitude of the bias radio-frequency power supplied in step S3-2. The pressure is set to, for example, 10 Torr (1.3 kPa) to 200 Torr (26.7 kPa). The pressure may be determined in order to set the temperature or the temperature increase rate to a predetermined value. For example, the pressure may be set such that the difference between the etching start temperature and the temperature when the etching is ended is 30° C. to 50° C. or higher. The pressure may be set to a constant value or may be changed, during the etching. In step S3, the etching is started after the temperature of the stage ST at the starting time of the etching is adjusted to a predetermined temperature equal to or lower than −70° C. (−110° C. in an example), and the transfer of the heat input from plasma during the etching and the heat from the heat transfer gas to the stage ST is adjusted. As a result, the surface temperature of the substrate or the substrate temperature is controlled to increase to a desired temperature at a predetermined rate during the etching. Hereinafter, an example where the surface temperature of the substrate is controlled during the etching will be described.

In step S4, the surface temperature of the substrate is increased by controlling the temperature of the stage ST, so as to volatilize a by-product. At this time, steps S3 and S4 may be performed in parallel with each other. That is, the surface temperature of the substrate may be increased thereby volatilizing a by-product, during the etching of the substrate with plasma. In steps S5, the substrate W is carried out from the chamber 1, and the method MT is ended.

[Etching Rate]

Figure 2:
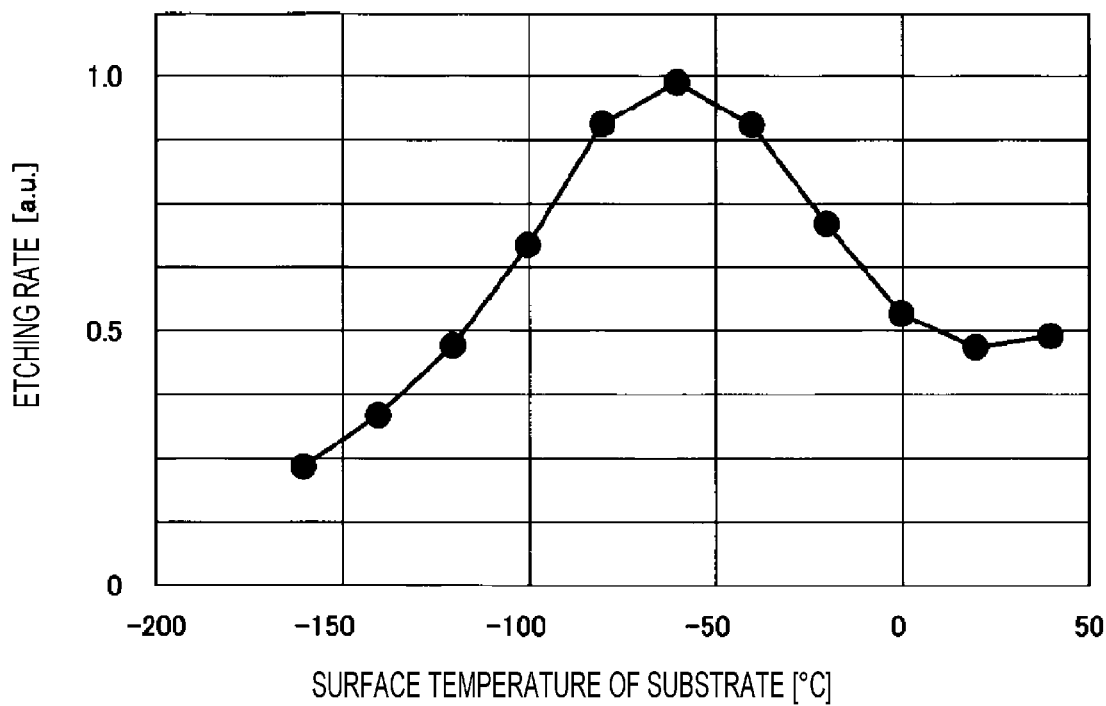
FIG. 2 is a view illustrating a dependence of an etching rate of a silicon oxide film on a substrate temperature.

FIG. 2 represents an etching rate obtained when the silicon oxide film is etched by changing the surface temperature of the substrate under the following condition.

(Condition of Step S3)

HF Power: 100 W, 60 MHz

LF Power: 1 kW, 3.2 MHz

Gas: $CF_4$ gas, $H_2$ gas

Pressure in Space between Back Surface of Substrate and Electrostatic Chuck 5: 50 Torr The etching rate increases until the surface temperature of the substrate decreases from about 20° C. (room temperature) to about −60° C. to about −70° C., and monotonously decreases from the temperature of −70° C. or lower. The etching rate at around −70° C. is about twice the etching rate at around 20° C.

Figure 3:
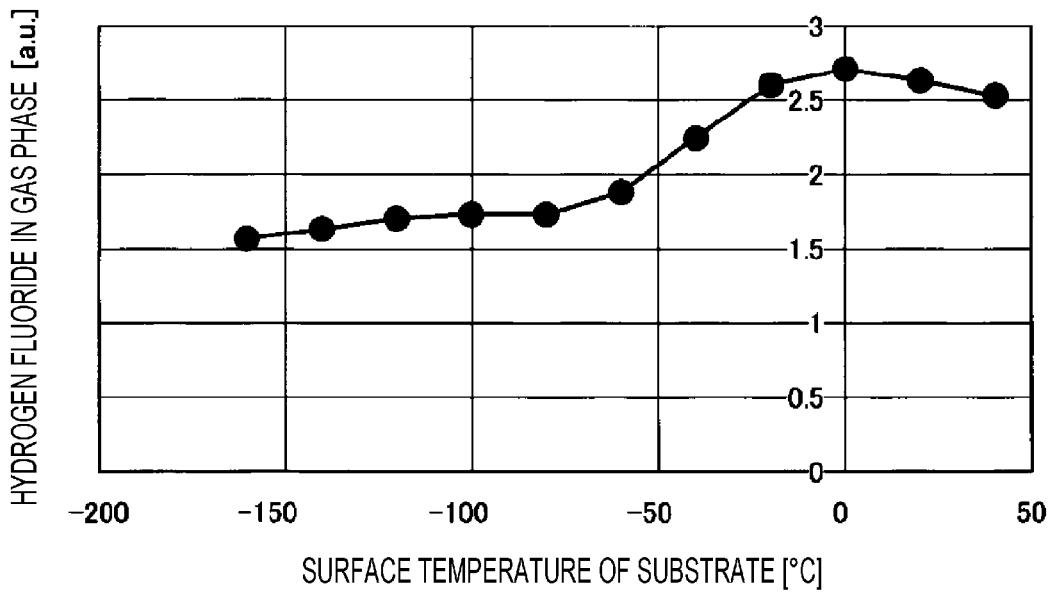
FIG. 3 is a view illustrating an amount of an HF etchant in a gas phase.

FIG. 3 represents a dependence of an amount of HF included in the gas phase on the surface temperature of the substrate. According to FIG. 3, the amount of HF in the gas phase starts to decrease at around 0° C. In addition, the amount of HF gradually decreases as the surface temperature of the substrate decreases from about −70° C. to a further low temperature. That is, the amount of HF adsorbed onto the substrate increases until the surface temperature of the substrate reaches about −70° C. from the room temperature. It is presumed that the increase of the etching rate illustrated in FIG. 2 is due to the fact that the supply amount of HF (etchant) increases as the surface temperature of the substrate decreases from the room temperature to a further low temperature, and is maximized at about −70° C. Meanwhile, when the adsorption amount of the etchant becomes excessive at the lower temperature than −70° C., the etching may not be progressed unless the ion energy from plasma is sufficiently large. Accordingly, the bias radio-frequency power (LF power) supplied to the substrate needs to provide a sufficient energy enough to impart the energy to the etchant thereby causing the etchant to react with silicon oxide. The magnitude of the LF power is 2 kW or more. In order to increase the etching rate, the LF power may be increased, and may be, for example, 5 kW or more or 10 kW or more. When the LF power is increased, the directivity (verticality) of ions incident on the substrate is improved, and the incidence on the side wall of an etching recess is reduced, so that an occurrence of a shape abnormality such as bowing in the side wall may be suppressed.

When the silicon oxide film is etched by the gas containing fluorine and hydrogen, $SiF_x$ ($SiF_4$ in this example) is generated as a by-product. For example, the amount of volatilization of the etching by-product from the substrate is reduced as the temperature is lowered. From the viewpoint of promoting the volatilization of the by-product, it is appropriate that the surface temperature of the substrate is −110° C. or higher. Furthermore, the surface temperature of the substrate is preferably −70° C. or higher. More preferably, the surface temperature of the substrate is 0° C. or higher. In addition, by increasing the LF power so as to increase the volatilization amount, the etching rate may be improved.

[Surface Temperature of Substrate During Etching]

Next, descriptions will be made on a change in the surface temperature of the substrate during the etching, with reference to FIG. 4. Below is a condition of step S3.

(Condition of Step S3)

HF Power: 2 kW, 60 MHz

LF Power: 0.5 kW to 4 kW, 3.2 MHz

Gas: $CF_4$ gas, $H_2$ gas

Pressure in Space between Back Surface of Substrate and Electrostatic Chuck 5: 10 Torr (1.3 kPa), 50 Torr (6.7 kPa)

Etching Time: 30 seconds

Figure 4:
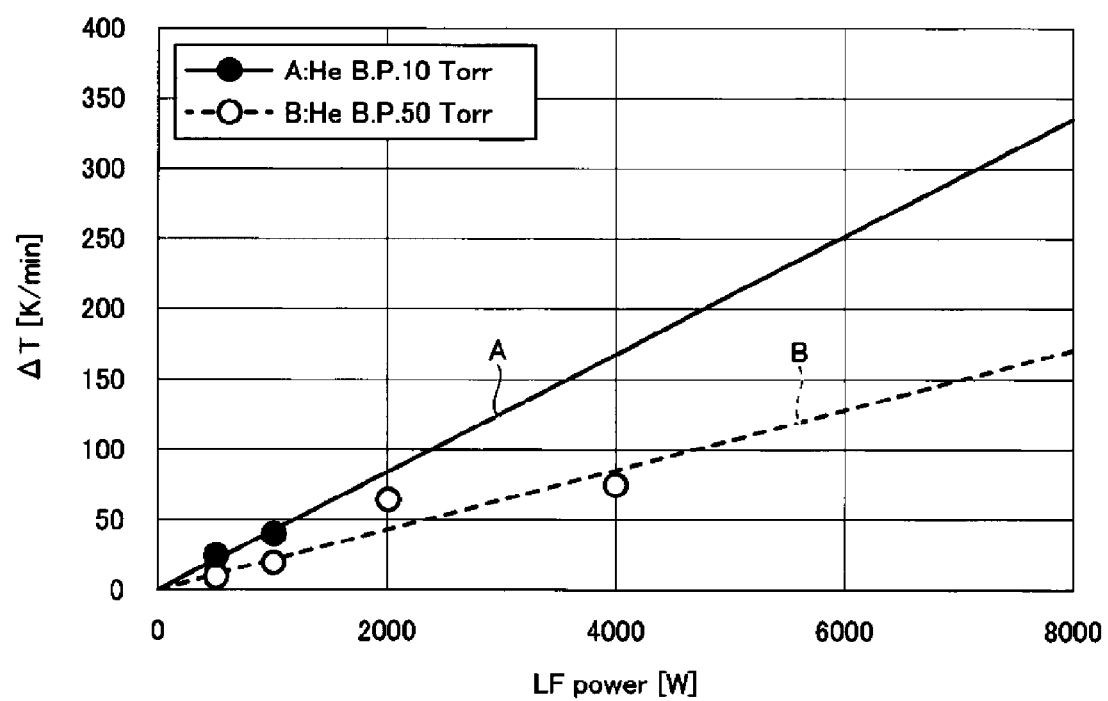
FIG. 4 is a view illustrating a dependence of an increase of a substrate temperature on a bias power in an etching of a silicon oxide film.

In FIG. 4, the horizontal axis represents the LF power, and the vertical axis represents a difference ΔT in the temperature of the substrate.

As the LF power was large, the difference ΔT in the surface temperature of the substrate increased. It may be found that the increase of the substrate temperature during the etching may be controlled by the magnitude of the LF power applied to the stage ST. The heat input from plasma is caused to exceed the amount of transfer of the heat of the substrate toward the stage ST by helium gas in the space between the back surface of the substrate and the electrostatic chuck 5, so that the surface temperature of the substrate may be increased.

Of the graphs of FIG. 4, a straight line A represents a change in surface temperature of the substrate when the etching is performed by controlling the pressure in the space between the back surface of the substrate and the electrostatic chuck 5 to be 10 Torr. A straight line B represents a change in surface temperature of the substrate when the etching is performed by controlling the pressure in the space between the back surface of the substrate and the electrostatic chuck 5 to be 50 Torr. It may be found that by changing the pressure in the space between the back surface of the substrate and the electrostatic chuck 5, the amount of heat transfer from the back surface of the substrate may be adjusted, and the increase of the surface temperature of the substrate may be controlled.

In an example, the LF power supplied during the etching and/or the pressure in the space between the back surface of the substrate and the electrostatic chuck 5 are controlled in order to improve the etching rate.

The etching rate is determined by the adsorption amount of the etchant and the supply amount of the ion energy for causing a chemical reaction. When the temperature becomes low, the adsorption amount of the etchant may be increased, whereas the further large ion energy is required to cause a chemical reaction.

Thus, when a relatively small LF power (e.g., 2 kW) is supplied, and the substrate having a surface temperature of about −100° C. or lower is etched, it is highly likely that the etching stop occurs or the etching rate decreases.

Meanwhile, when a relatively large LF power (e.g., 5 kW or more) is supplied, the etching rate may be increased as the etching start temperature becomes low. This is because the etchant is supplied much at a low temperature, so that the ion energy by the LF power promotes a reaction.

In addition, when the etching is continued at the low temperature of −70° C. or lower, the volatilization of the by-product generated by the etching decreases, and as a result, the etching rate decreases. In order to improve the etching rate, the volatilization of the by-product may be promoted by increasing the LF power or increasing the surface temperature of the substrate.

In order to progress the etching, it is necessary to supply the etchant to the bottom of the etching recess. Since the aspect increases as the etching is progressed, it is necessary to supply a sufficient amount of etchant to the area deeper than the vicinity of the opening of the etching recess. When the temperature is relatively high, an adhesion coefficient becomes small, so that the etchant may be easily supplied to the bottom of the etching recess.

Since a solidification or condensation point moves to a relatively high temperature due to a capillary condensation phenomenon such that the vapor pressure of the by-product is lowered, and further, the volatilization substance is highly likely to be re-adhered to the side wall, it becomes difficult for the by-product to be volatilized in the area with the relatively high aspect. Thus, it is preferable to increase the surface temperature of the substrate as the etching is progressed, thereby promoting the volatilization of the by-product. In an example, the surface temperature of the substrate is increased by 30° C. to 50° C. or higher from the temperature at the start time of the etching.

From the descriptions above, the etching start temperature (temperature of the stage ST) is preferably −70° C. or lower at which the adsorption amount of the etchant increases, and the surface temperature of the substrate at the end time of the etching (hereinafter, also referred to as an "etching end temperature") may be higher than the etching start temperature. Since the volatilization of the by-product becomes difficult as the etching is progressed, the temperature is increased from the etching start temperature as the etching is progressed, thereby promoting the discharge of the by-product. When the surface temperature of the substrate is increased, the adhesion coefficient of the etchant becomes small, so that the etchant may be supplied to the area with the relatively high aspect. When the surface temperature of the substrate is increased, the discharge of the by-product is promoted. The etching end temperature is preferably −70° C. or higher at which the by-product ($SiF_4$) is volatilized. Further considering the discharge performance of the by-product, the etching end temperature is more preferably 0° C. or higher. The increase of the substrate temperature may be controlled by adjusting the pressure of the heat transfer gas supplied between the back surface of the substrate and the electrostatic chuck, and the LF power.

In addition, it is known that the adsorption of the etchant is promoted under the presence of water or ammonia. When a processing gas is supplied under the presence of water, and the etching is performed, the supply of the etchant to the bottom of the etching recess is promoted, so that the etching rate may be improved. The water is present in the chamber 1 due to the desorption of water ($H_2O$) molecules adsorbed on the inner wall of the chamber 1, or is supplied from a gas supply. The ammonia gas is supplied from a gas supply. Due to an interaction of a hydrogen bond between hydrogen fluoride generated from a methane tetrafluoride gas of a processing gas and hydrogen, and water or ammonia, the hydrogen fluoride is adhered to the substrate at a higher temperature than that in a case where water or ammonia is not present, and supplied to the bottom of the etching recess formed in the substrate.

In addition, in order to increase the temperature of the substrate from the etching start temperature to the etching end temperature, the heat input from plasma by the LF power and/or the pressure in the space between the back surface of the substrate and the electrostatic chuck 5 may be adjusted as illustrated in FIG. 4. The temperature of a heat exchange medium allowed to flow into the stage ST may be controlled to increase the temperature of the substrate from the etching start temperature to the etching end temperature. In another example, the temperature of the substrate may be increased by a heat source such as, for example, radiation, microwaves, UV light, infrared light, visible light or laser.

As described above, by controlling the surface temperature of the substrate before the start of etching and the increase of the surface temperature of the substrate thereafter, the relatively high etching rate may be implemented.

In another example, hydrogen fluoride may be supplied, instead of $CF_4$ and $H_2$. Further, in yet another example, a gas containing nitrogen trifluoride ($NF_3$) may be supplied, instead of the carbon tetrafluoride ($CF_4$) gas, as the gas containing fluorine and hydrogen, in the plasma etching step. According to a necessity, a rare gas such as argon may be supplied. Water or ammonia may be further added.

As yet another example, sulfur hexafluoride ($SF_6$) gas may be supplied, instead of the carbon tetrafluoride ($CF_4$) gas, as the gas containing fluorine in the plasma etching step. According to a necessity, a rare gas such as argon may be supplied. Water or ammonia may be further added.

Step S4, that is, the step of increasing the surface temperature of the substrate thereby volatilizing the by-product may be performed after the step of etching the substrate with plasma. As a result, the step of etching the substrate with plasma and the step of increasing the temperature of the substrate may be performed in different chambers. In addition, the etching according to the present embodiment may be performed as a main etching, and then, an over etching may be performed in a different chamber at a higher temperature than that in the present embodiment.

[Plasma Processing Apparatus]

A plasma processing apparatus described below may be used for the etching. The plasma processing apparatus described below is an example of several plasma generation systems which are used for exciting plasma from a processing gas. FIG. 5 represents a capacitively coupled plasma (CCP) apparatus in which plasma 2 is formed between the upper electrode 3 and the stage ST in the chamber 1. The stage ST includes a lower electrode 4 and the electrostatic chuck 5. The substrate W is held on the lower electrode 4. As illustrated in FIG. 5, the RF source 6 and the RF source 7 are connected to the upper electrode 3 and the lower electrode 4, respectively, and may use different RF frequencies. In another example, the RF source 6 and the RF source 7 may be connected to the same electrode. In addition, a direct current (DC) power source may be connected to the upper electrode. The gas source 8 is connected to the chamber 1 to supply a processing gas. In addition, an exhaust device 9 is connected to the chamber 1 to exhaust the inside of the chamber 1. In addition, a temperature sensor may be provided to measure the temperature of the substrate in a non-contact manner.

The plasma processing apparatus of FIG. 5 is provided with a controller 80 including a processor and a memory, and controls each component of the plasma processing apparatus to process the substrate W with plasma.

In addition, in the etching method according to the embodiment, the pulse-type DC voltage may be applied to the stage ST in the step of etching the silicon oxide film. In addition, the duty ratio of the LF power supplied from the RF source 7 may be changed.

In addition, in the step of increasing the surface temperature of the substrate thereby volatizing the by-product, when the surface temperature of the substrate increases to a desired temperature or higher, the increase speed of the surface temperature of the substrate may be controlled by supplying the heat transfer gas between the substrate and the stage ST and/or controlling the radio-frequency power, referring to the temperature increase of the stage ST.

In the step of etching the silicon oxide film, the etching may be performed at a relatively low temperature until a timing immediately before the etching is ended, and may be ended by increasing the temperature to a relatively high temperature. That is, the main etching may be performed at a relatively low temperature, and the over etching may be performed by increasing the temperature (to about the room temperature). The etching stop may be performed by increasing the temperature. At this time, the main etching at the relatively low temperature and the over etching at the relatively high temperature may be performed in different chambers.

A dry cleaning may be performed using plasma between the main etching and the over etching.

While the plasma processing apparatus of the present disclosure is a capacitively coupled plasma (CCP) type plasma processing apparatus as described above, other plasma processing apparatuses may be used. For example, an inductively coupled plasma (ICP) type plasma processing apparatus, a radial line slot antenna (RLSA) type plasma processing apparatus, an electron cyclotron resonance plasma (ECR) type plasma processing apparatus, and a helicon wave plasma (HWP) type plasma processing apparatus may be used.

According to an aspect, the etching rate may be improved.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A method of etching comprising:
providing a substrate including a silicon oxide film on a stage;
controlling a surface temperature of the substrate to be −70° C. or lower;
etching the silicon oxide film plasma generated from a gas containing fluorine and hydrogen using a radio-frequency power, after the controlling of the surface temperature of the substrate; and
increasing the surface temperature of the substrate to volatilize a by-product generated by the etching,
wherein the increasing of the surface temperature includes controlling the surface temperature of the substrate by a pressure in a space between a back surface of the substrate and the stage, and by a bias radio-frequency power supplied to the stage.

2. The method according to claim 1, wherein the substrate further includes a silicon-containing film other than the silicon oxide film.

3. The method according to claim 2, wherein the substrate includes a stacked film of the silicon oxide film and a pol silicon film or a stacked film of the silicon oxide film and a silicon nitride film.

4. The method according to claim 2, wherein a metal-containing mask is formed on the silicon-containing film.

5. The method according to claim 4, wherein the metal-containing mask is formed of a material including tungsten, titanium, molybdenum, ruthenium, hafnium or aluminum.

6. The method according to claim 1, wherein an aspect ratio of a recess formed in the substrate is 5 or more.

7. The method according to claim 1, wherein in the etching the silicon oxide film, a duty ratio of a bias radio-frequency power supplied to the stage is changed.

8. The method according to claim 1, wherein in the etching the silicon oxide film, a duty ratio of the radio-frequency power for plasma generation is changed.

9. The method according to claim 1, wherein in the etching the silicon oxide film, a pulse-type DC voltage is applied to the stage.

10. The method according to claim 1, wherein an ending temperature of the etching the silicon oxide film is higher by 30° C. or more than a starting temperature of the etching the silicon oxide film.

11. The method according to claim 10, wherein the ending temperature of the etching the silicon oxide film is higher by 50° C. or more than the starting temperature of the etching the silicon oxide film.

12. The method according to claim 1, wherein the increasing the surface temperature of the substrate is performed during the etching of the silicon oxide film with plasma.

13. The method according to claim 1, wherein the gas containing fluorine and hydrogen comprises a fluorocarbon gas containing F and a hydrogen-containing gas including at least one selected from the group consisting of: $H_2$, $NH_3$, $H_2O$ and $CH_4$.

14. The method according to claim 1, wherein the gas containing fluorine and hydrogen comprises a hydrofluorocarbon (CHF) gas.

15. The method according to claim 1, wherein the gas containing flu e and hydrogen comprises a hydrogen fluoride (HF) gas.

16. The method according to claim 1, wherein the method is performed in a processing chamber having an upper electrode, and during generating of the plasma, the radio-frequency power is applied to the upper electrode.

17. A method of etching comprising:
providing a substrate including a silicon oxide film on a stage;
controlling a surface temperature of the substrate to be −70° C. or lower;
etching the silicon oxide film with plasma generated from a gas containing fluorine and hydrogen using a radio-frequency power, after the controlling of the surface temperature of the substrate; and
increasing the surface temperature of the substrate to volatilize a by-product generated by the etching,
wherein the increasing of the surface temperature of the substrate is performed during the etching of the silicon oxide film with plasma, and
the gas containing fluorine and hydrogen comprises a hydrogen fluoride (HF) gas.

18. The method of claim 17, wherein the increasing the surface temperature includes controlling the surface temperature of the substrate by a pressure in a space between a back surface of the substrate and the stage, and by a bias radio-frequency power supplied to the stage.

19. The method of claim 17, wherein an ending temperature of the etching the silicon oxide film is higher by 30° C. or more than a starting temperature of the etching the silicon oxide film.

* * * * *